US010916315B2

United States Patent
Yu et al.

(10) Patent No.: US 10,916,315 B2
(45) Date of Patent: Feb. 9, 2021

(54) NONVOLATILE MEMORY DEVICE

(71) Applicant: SAMSUNG ELECTRONICS CO., LTD., Suwon-si (KR)

(72) Inventors: Seung Woo Yu, Suwon-si (KR); Sang Lok Kim, Seoul (KR); Byung Kwan Chun, Seoul (KR); Byung Hoon Jeong, Gyeonggi-Do (KR); Jeong Don Ihm, Seongnam-si (KR); Young Don Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/779,484

(22) Filed: Jan. 31, 2020

(65) Prior Publication Data
US 2020/0258583 A1    Aug. 13, 2020

(30) Foreign Application Priority Data
Feb. 11, 2019   (KR) .................. 10-2019-0015298

(51) Int. Cl.
*G11C 16/32*  (2006.01)
*G11C 7/10*  (2006.01)
*G11C 7/22*  (2006.01)

(52) U.S. Cl.
CPC ............ *G11C 16/32* (2013.01); *G11C 7/1012* (2013.01); *G11C 7/1078* (2013.01); *G11C 7/22* (2013.01)

(58) Field of Classification Search
None
See application file for complete search history.

(56) References Cited

U.S. PATENT DOCUMENTS

| | | | |
|---|---|---|---|
| 5,774,133 A | 6/1998 | Neave et al. | |
| 5,784,649 A | 7/1998 | Begur et al. | |
| 6,779,055 B2 | 8/2004 | Kim et al. | |
| 7,061,941 B1* | 6/2006 | Zheng .................. | G11C 7/1051 365/230.02 |
| 7,975,081 B2 | 7/2011 | Okada | |
| 8,321,713 B2 | 11/2012 | Nobunaga | |
| 9,543,967 B2 | 1/2017 | Takahashi | |
| 9,576,626 B2 | 2/2017 | Jang et al. | |
| 9,773,566 B2 | 9/2017 | Jang et al. | |
| 10,063,240 B2 | 8/2018 | Mazumder | |

* cited by examiner

*Primary Examiner* — James G Norman
(74) *Attorney, Agent, or Firm* — Volentine, Whitt & Francos, PLLC

(57) ABSTRACT

A nonvolatile memory device includes a first memory cell array, a first bi-directional multiplexer, a first register, a second register, a first I/O pad and a second I/O pad. The first memory cell array stores first data. The first bi-directional multiplexer receives the first data and distributes the first data into first sub-data and second sub-data. The first register stores first sub-data from the first bi-directional multiplexer. The second register stores second sub-data from a second bi-directional multiplexer. The first I/O pad outputs the first sub-data from the first register to outside. The second I/O pad outputs the second sub-data from the second register to the outside.

20 Claims, 11 Drawing Sheets

700

900

NONVOLATILE MEMORY DEVICE

This U.S. non-provisional patent application claims the benefit of priority under 35 U.S.C. § 119 to Korean Patent Application No. 10-2019-0015298, filed on Feb. 11, 2019 in the Korean Intellectual Property Office, the disclosure of which is incorporated herein in its entirety by reference.

BACKGROUND

1. Technical Field

The present disclosure relates to a nonvolatile memory device.

2. Description of the Related Art

A semiconductor memory device is a storage device that may store data so that the data can be read when necessary. Semiconductor memory devices may be roughly divided into RAM (Random Access Memory) devices and ROM (Read Only Memory) devices. RAM devices are volatile memory devices in which stored data disappears when power is turned off. ROM devices are nonvolatile memory devices in which the stored data does not disappear even when the power is turned off. RAM devices include a DRAM (Dynamic RAM), a SRAM (Static RAM), and the like. ROM devices include a PROM (Programmable ROM), an EPROM (Erasable PROM), an EEPROM (Electrically EPROM), a flash memory device, and the like.

As microprocessor speeds increase, an increase in speed is also required in semiconductor memory devices. For this reason, semiconductor memory devices that incorporate a pipeline technique have been introduced. The pipeline technique divides a series of processes performed in the semiconductor memory devices so that different processes are performed in parallel by different parts of a processor. The series of processes may include, for example, an input of an address first, decoding of the address second, an output of data from a memory cell third, a data transfer to an output circuit fourth, and a data output in/from the semiconductor memory device fifth. In the pipeline technique, first processing is executed on a first command, then second processing is started on the first command as the first processing is started on a second command so that the second processing on the first command and the first processing on the second command are performed simultaneously. Therefore, the semiconductor memory device using the pipeline technique may efficiently improve the processing speed of the commands. The semiconductor memory device may use a wave pipeline system which uses a known or predictable propagation delay of a logic circuit, and control a waiting time of data output by using final registers connected to the output.

However, a skew occurs in a path between the output and the final registers connected to the output when operating at HF (High Frequency), and performance characteristics therefore deteriorate. As a result, a high-speed operation of the semiconductor memory devices may be difficult.

SUMMARY

Aspects of the present disclosure provide a nonvolatile memory device which operates at high speed.

Aspects of the present disclosure also provide a nonvolatile memory device which reduces a skew between output data and a clock signal.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present disclosure, a nonvolatile memory device includes a first memory cell array, a first bi-directional multiplexer, a second bi-directional multiplexer, a first register, a second register, a first I/O pad and a second I/O pad. The first memory cell array stores first data. The first bi-directional multiplexer receives the first data and distributes the first data into first sub-data and second sub-data. The second bi-directional multiplexer receives the second sub-data from the first bi-directional multiplexer. The first register stores the first sub-data from the first bi-directional multiplexer. The second register stores the second sub-data from the second bi-directional multiplexer. The first I/O pad outputs the first sub-data from the first register to outside. The second I/O pad outputs the second sub-data from the second register to the outside.

According to another exemplary embodiment of the present disclosure, a nonvolatile memory device includes a first I/O pad, a first register, a first bi-directional multiplexer, a second bi-directional multiplexer, a first memory cell array and a second memory cell array. The first I/O pad receives first data. The first register stores the first data and transmits the first data to the first I/O pad. The first bi-directional multiplexer transmits the first data to the first register. The first data includes first sub-data and second sub-data. The second bi-directional multiplexer transmits the second sub-data. The first memory cell array stores the first sub-data and transmits the first sub-data to the first bi-directional multiplexer and the second memory cell array stores the second sub-data and transmits the second sub-data to the second bi-directional multiplexer.

According to yet another exemplary embodiment of the present disclosure, a nonvolatile memory device includes a first memory cell array, a second memory cell array, a first bi-directional multiplexer, a second bi-directional multiplexer, a first register, a second register, a first I/O pad and a second I/O pad. The first memory cell array stores first data and the second memory cell array stores second data. The first bi-directional multiplexer receives the first data. The first data includes first sub-data and second sub-data. The second bi-directional multiplexer receives the second data. The second data includes third sub-data and fourth sub-data. The second bi-directional multiplexer receives the second sub-data from the first bi-directional multiplexer, and transmits the fourth sub-data to the first bi-directional multiplexer. The first register receives the first sub-data and the third sub-data from the first bi-directional multiplexer. The second register receives the second sub-data and the fourth sub-data from the second bi-directional multiplexer. The first I/O pad outputs the first sub-data and the third sub-data from the first register to outside and the second I/O pad outputs the second sub-data and the fourth sub-data from the second register to the outside. A frequency of a first clock applied to the first bi-directional multiplexer and the second bi-directional multiplexer is lower than a frequency of a second clock applied to the first register and the second register.

These and/or other aspects will become apparent and more readily appreciated from the following description of the embodiments, taken in conjunction with the accompanying drawings.

DETAILED DESCRIPTION OF THE EMBODIMENTS

Figure 1:
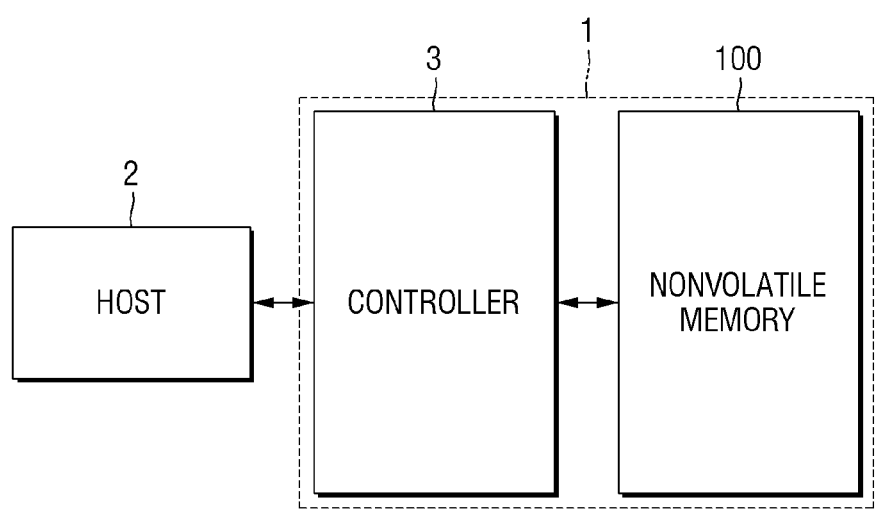
FIG. 1 is an exemplary block diagram illustrating a storage device including a nonvolatile memory device.

FIG. 1 is an exemplary block diagram illustrating a storage device including a nonvolatile memory device.

Referring to FIG. 1, a storage device 1 includes a nonvolatile memory device 100 and a controller 3.

The controller 3 may be connected to the host 2 and the nonvolatile memory device 100. The controller 3 may access the nonvolatile memory device 100 in response to a request from the host 2. For example, the controller 3 may be configured to control the read, program, erase, and background operations of the nonvolatile memory device 100.

Figure 11:
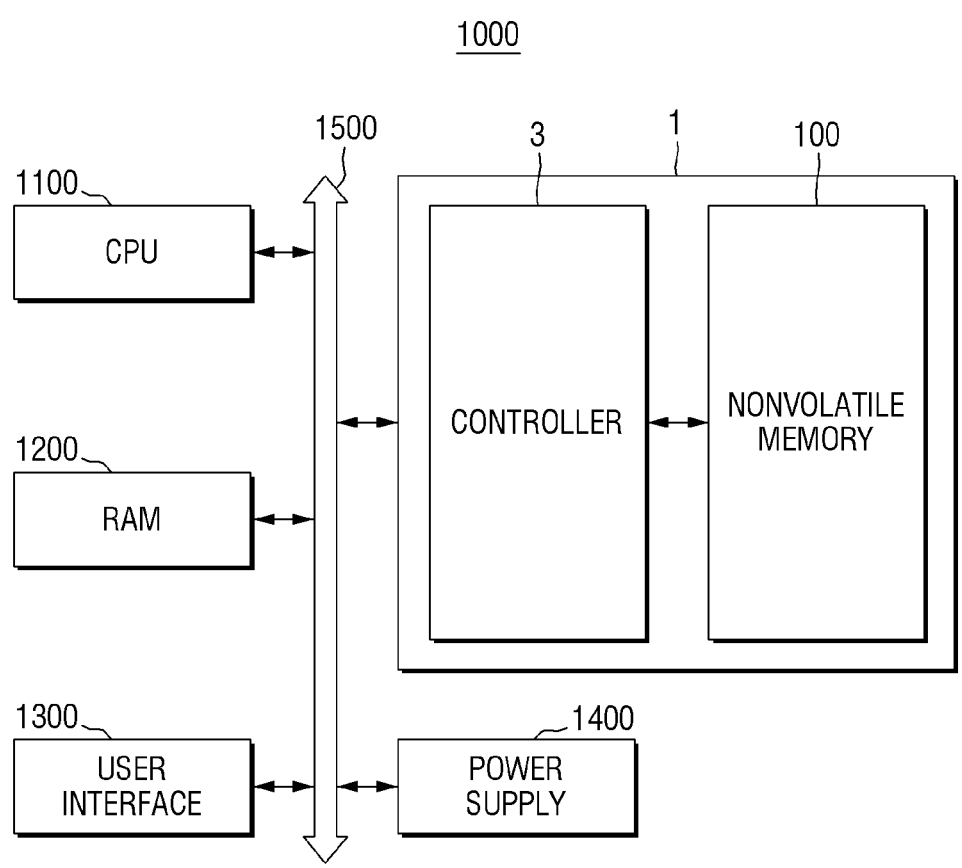
FIG. 11 is a block diagram illustrating a computing system including a nonvolatile memory device according to some embodiments of the present disclosure.

The controller 3 may include an interface. In addition, the controller 3 may drive the firmware to control the nonvolatile memory device 100. Before proceeding, it should be clear that FIGS. herein including FIG. 1 and FIG. 11 show and reference circuitry with a label as a "controller". Such circuitry may be or include a processor including a microprocessor or application specific integrated circuit (ASIC) and other elements with other labels. As is traditional in the field of the inventive concept(s) described herein, examples may be described and illustrated in terms of blocks such as circuits and other elements which carry out a described function or functions. These blocks, which may be referred to herein as controller and the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the present disclosure. Likewise, the blocks of the examples may be physically combined into more complex blocks without departing from the scope of the present disclosure.

Figure 2:
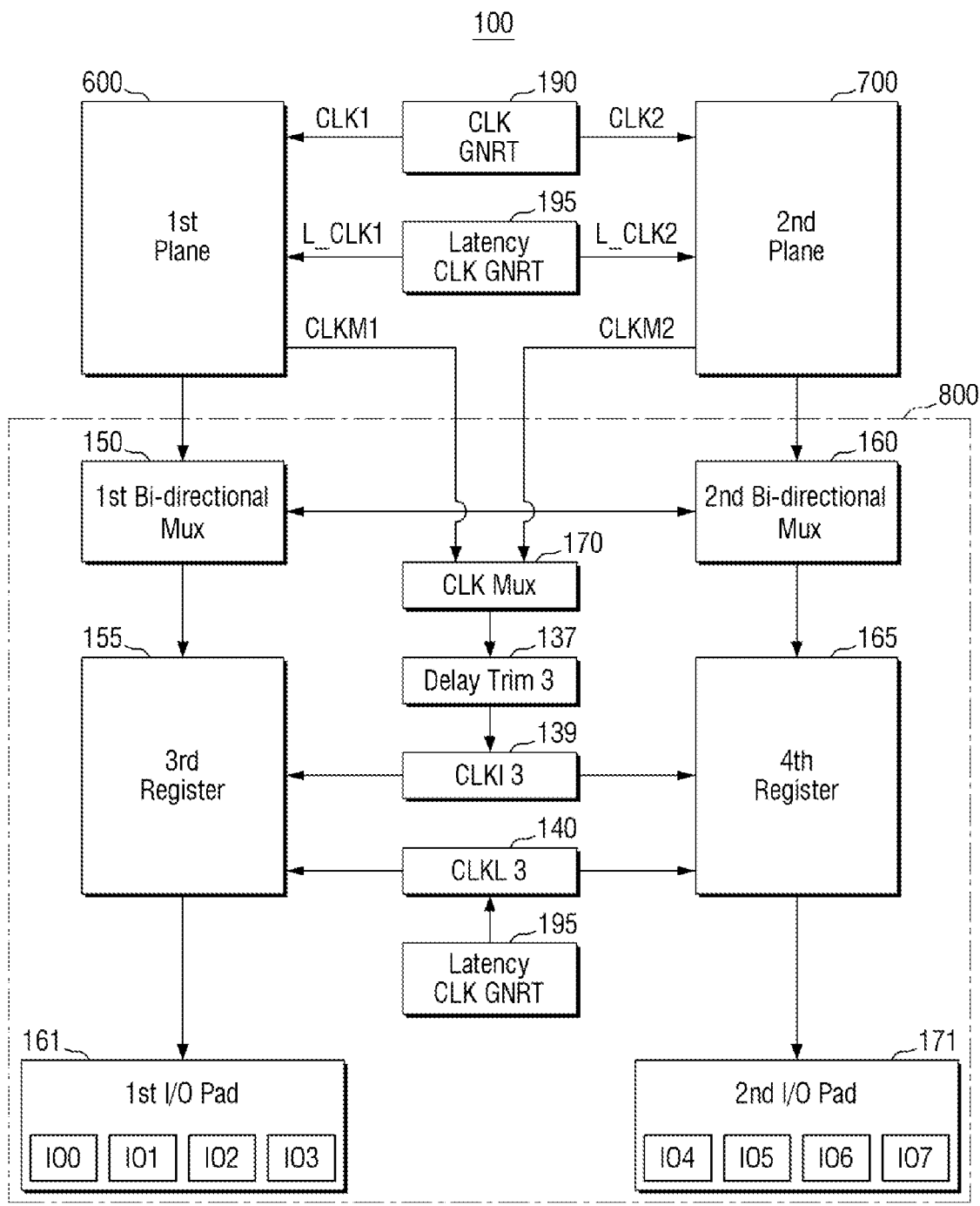
FIG. 2 is an exemplary block diagram illustrating the nonvolatile memory device of FIG. 1.
Figure 3:
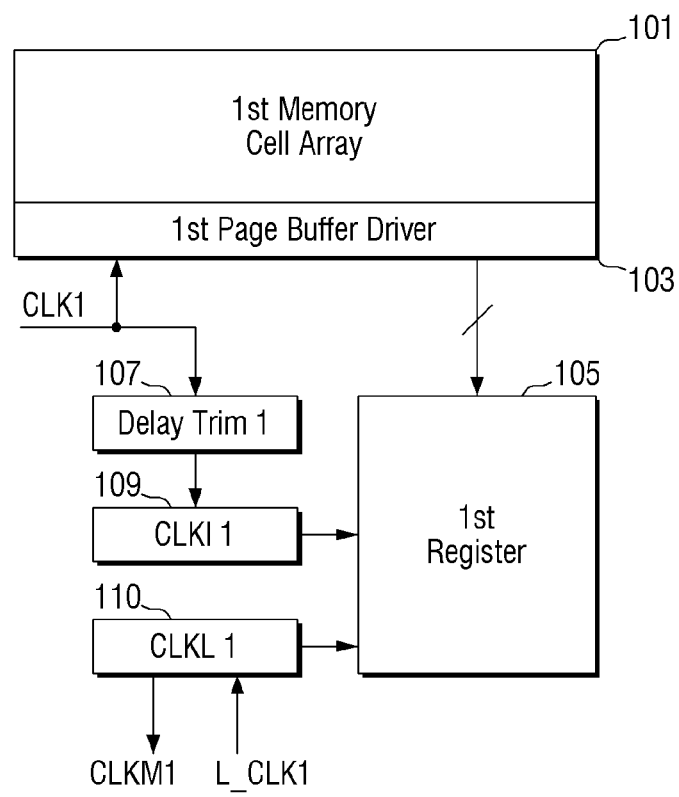
FIG. 3 is an exemplary block diagram illustrating a first plane of FIG. 2.
Figure 4:
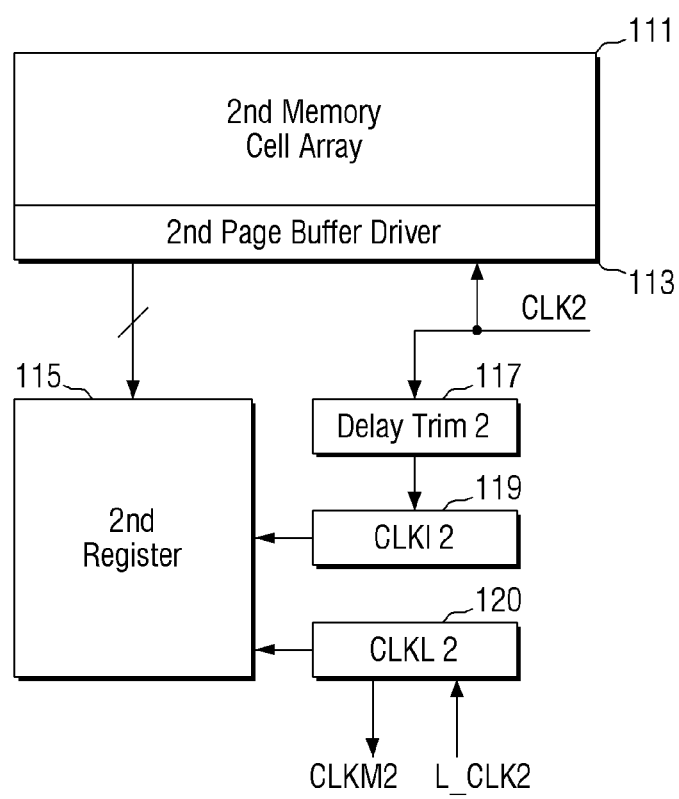
FIG. 4 is an exemplary block diagram illustrating a second plane of FIG. 2.

FIG. 2 is an exemplary block diagram illustrating the nonvolatile memory device of FIG. 1. FIG. 3 is an exemplary block diagram illustrating a first plane of FIG. 2. FIG. 4 is an exemplary block diagram illustrating a second plane of FIG. 2.

Referring to FIG. 2, the nonvolatile memory device 100 includes a first plane 600, a second plane 700, and a last stage 800 of the nonvolatile memory device. A clock generator 190 and/or a latency clock generator 195 may be provided external to the nonvolatile memory device 100 or may be included as components of the nonvolatile memory device 100. Notably, the latency clock generator 195 may be physically and/or logically separate from the clock generator 190. The last stage 800 of the nonvolatile memory device includes a first bi-directional multiplexer 150, a second bi-directional multiplexer 160, a third register 155, a fourth register 165, a first I/O pad 161, a second I/O pad 171, a clock multiplexer 170, a third delay trim 137, a third clock input 139, and a third clock latency input 140.

The nonvolatile memory device 100 may operate in synchronization with an external clock such as a clock generator 190 and/or a latency clock generator 195. Incidentally, when the frequency of the clock generator 190 rises, the latency may continuously increase. Here, the latency is the number of cycles of the clock generator 190 which is required until first data is output after the output command is input to the nonvolatile memory device 100 from the outside. The "outside" may be external to the nonvolatile memory device 100, or external to a device or system that includes the nonvolatile memory device 100. Additionally, the output command may be received over an electronic communications network by/at such a device or system, or as an input via an input interface such as a touchscreen, keypad or other input mechanism for inputting commands. The nonvolatile memory device 100 may use a wave pipeline system which utilizes the latency clock generator 195 in order to efficiently control an increase in delay, though the structure of the wave pipeline system is not limited thereto.

Referring to FIGS. 2 and 3, the first plane 600 includes a first memory cell array 101, a first page buffer driver 103, a first delay trim 107, a first clock input 109, a first clock latency input 110, and a first register 105.

The first plane 600 is an exemplary block diagram using the wave pipeline system, but the configuration of the first plane 600 is not limited thereto.

When an output command of the first data in the first memory cell array 101 is input, the first data is transmitted from the first memory cell array 101 to the first register 105 via the first page buffer driver 103. The first data may be parallel data that is transmitted or otherwise processed in parallel with other data such as second data. The transmission scheme of the first data is not limited thereto.

The first data that are output from the first memory cell array 101 are synchronized with a first clock signal CLK1 generated by the clock generator 190 and may be stored in the first register 105. The first clock signal CLK1 may be transmitted to the first register 105 via the first delay trim 107 and the first clock input 109, but the transmission scheme is not limited thereto. In addition, a first latency clock signal L_CLK1 transmitted through the latency clock generator 195 for a latency control may be imparted (communicated) to the first register 105. The first latency clock signal L_CLK1 may be transmitted to the first register 105 through the first clock latency input 110. The first clock latency input 110 may transmit the first clock multiplexer signal CLKM1 to the clock multiplexer 170.

Referring to FIGS. 2 and 4, the second plane 700 includes a second memory cell array 111, a second page buffer driver 113, a second delay trim 117, a second clock input 119, a second clock latency input 120, and a second register 115.

The second plane 700 is an exemplary block diagram using the wave pipeline system, but the configuration of the second plane 700 is not limited thereto.

When an output command of the second data in the second memory cell array 111 is input, the second data is transmitted from the second memory cell array 111 to the second register 115 via the second page buffer driver 113. The second data may be parallel data that is transmitted or otherwise processed in parallel with other data such as first data. The transmission scheme of the second data is not limited thereto.

The second data that are output from the second memory cell array 111 are synchronized with a second clock signal CLK2 generated by the clock generator 190 and may be stored in the second register 115. The second clock signal CLK2 may be transmitted to the second register 115 via the second delay trim 117 and the second clock input 119, but the transmission scheme is not limited thereto. In addition, a second latency clock signal L_CLK2 transmitted through the latency clock generator 195 for a delay control may be imparted (communicated) to the second register 115. The second latency clock signal L_CLK2 may be transmitted to the second register 115 through the second clock latency input 120. The second clock latency input 120 may transmit the second clock multiplexer signal CLKM2 to the clock multiplexer 170.

A route for outputting the first data in the first plane 600 will be described referring again to FIG. 2.

When outputting the first data in the first plane 600, the first clock multiplexer signal CLKM1 may be transmitted from the clock multiplexer 170 to the third register 155 and the fourth register 165 through the third delay trim 137 and the third clock input 139. The transmission scheme of the first clock multiplexer signal CLKM1 is not limited thereto. Also, the latency signal may be transmitted from the latency clock generator 195 to the third register 155 and the fourth register 165 through the third clock latency input 140 for a latency control. The clock input system according to the wave pipeline structure is not limited thereto.

The first sub-data of the first data in the first plane 600 may be transmitted to the third register 155 via the first bi-directional multiplexer 150. The first sub-data of the first data may be transmitted to the first I/O pad 161 through the third register 155. The first I/O pad 161 may include but is not limited to, first I/O register IO0 through fourth I/O register IO3.

Also, the second sub-data of the first data in the first plane 600 may be transmitted to the second bi-directional multiplexer 160 through the first bi-directional multiplexer 150. The second sub-data of the first data may be transmitted to the fourth register 165 through the second bi-directional multiplexer 160. The second sub-data of the first data may be transmitted to the second I/O pad 171 through the fourth register 165. The second I/O pad 171 may include, but is not limited to, fifth I/O register IO4 through eighth I/O register IO7.

The third register 155 and the fourth register 165 may operate in a HF (High Frequency) region, and a skew may occur between the first data and the clock signals transmitted through the third clock input 139 and/or the third clock latency input 140. Therefore, it is possible to reduce the possibility of occurrence or magnitude of skew by shortening the data transmission distance between the first I/O pad 161 and the second I/O pad 171 and the third register 155 and the fourth register 165, thereby enabling the high-speed operation of the nonvolatile memory device 100.

For example, a case where the first data is output up to the first I/O pad 161 and the second I/O pad 171 using one multiplexer and one register can be readily contrasted with embodiments based on FIG. 3. In this case, a route through which the first data travels to the first I/O pad 161 and the second I/O pad 171 arranged on the left and right through a single register operating with HF is longer than the last stage 800 of FIG. 2.

That is, by arranging the third register 155 and the fourth register 165 in one-to-one relationships with each of the first I/O pad 161 and the second I/O pad 171, it is possible to reduce the route of the first data operating at HF, thereby reducing the possibility of occurrence or magnitude of skew and enabling the high-speed operation of the nonvolatile memory device 100.

A route which outputs the second data in the second plane 700 will be described.

When outputting the second data in the second plane 700, the second clock multiplexer signal CLKM2 may be transmitted from the clock multiplexer 170 to the third register 155 and the fourth register 165 through the third delay trim 137 and the third clock input 139. The transmission scheme of the second clock multiplexer signal CLKM2 is not limited thereto. Also, a latency signal may be transmitted from the latency clock generator 195 to the third register 155 and the fourth register 165 through the third clock latency input 140 for a latency control. The clock input system according to the wave pipeline structure is not limited thereto.

The first sub-data of the second data in the second plane 700 may be transmitted to the fourth register 165 through the second bi-directional multiplexer 160. The first sub-data of the second data may be transmitted to the second I/O pad 171 through the fourth register 165. The second I/O pad 171 may include, but is not limited to, the fifth I/O register IO4 through eighth I/O register IO7.

Also, the second sub-data of the second data in the second plane 700 may be transmitted to the first bi-directional multiplexer 150 through the second bi-directional multiplexer 160. The second sub-data of the second data may be transmitted to the third register 155 through the first bi-directional multiplexer 150. The second sub-data of the second data may be transmitted to the first I/O pad 161 through the third register 155. The first I/O pad 161 may include, but is not limited to, first I/O register I/O0 through fourth I/O register IO3.

The third register and the fourth register may operate in the HF (High Frequency) region, and a skew may occur between the second data and clock signals transmitted through the third clock input 139 and/or the third clock latency input 140. Therefore, it is possible to reduce the possibility of occurrence or magnitude of skew, by shortening the data transmission distance between the first I/O pad 161 and the second I/O pad 171 and the third register 155 and the fourth register 165, thereby enabling the high-speed operation of the nonvolatile memory device 100.

For example, a case where the second data is output up to the first I/O pad 161 and the second I/O pad 171 using one multiplexer and one register can be readily contrasted with embodiments based on FIG. 4. In this case, the route through which the second data travels to the first I/O pad 161 and the second I/O pad 171 arranged on the left and right through a single register operating with HF is longer than the last stage 800 of FIG. 2.

That is, by arranging the third register 155 and the fourth register 165 in one-to-one relationships with each of the first I/O pad 161 and the second I/O pad 171, it is possible to reduce the route of the second data operating with HF, thereby reducing the possibility of occurrence or magnitude of skew and enabling the high-speed operation of the nonvolatile memory device 100.

Figure 5:
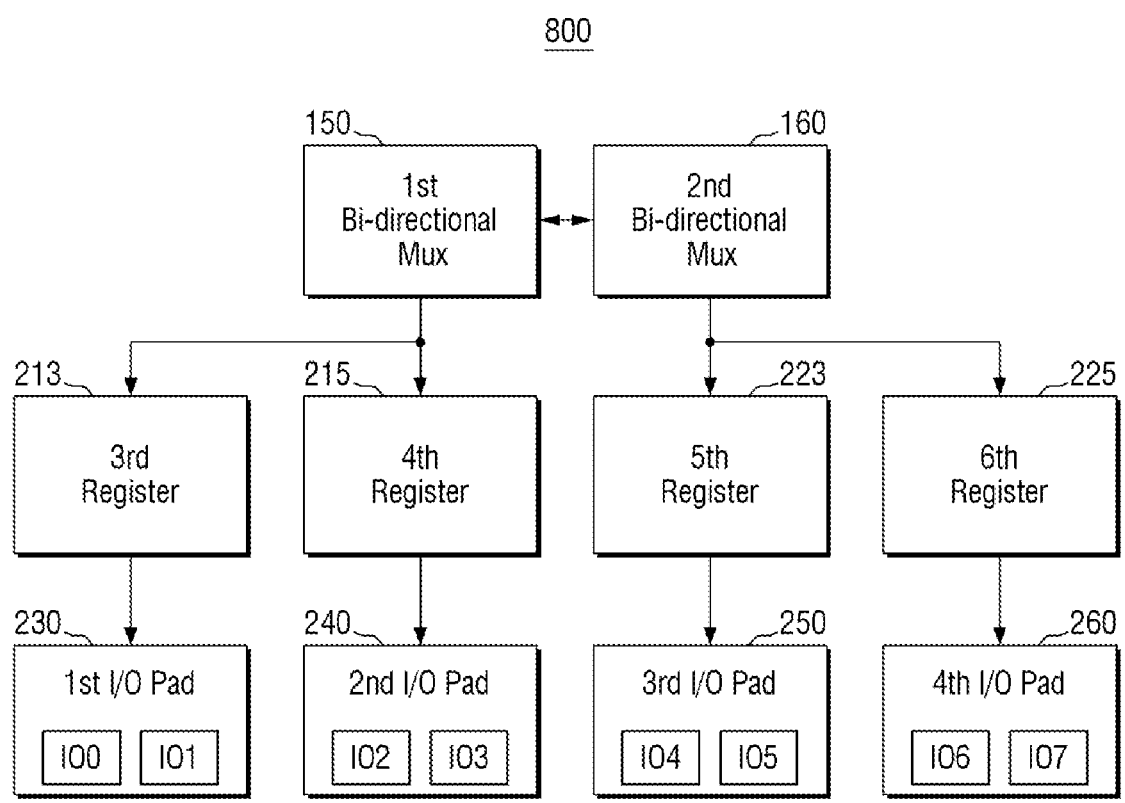
FIG. 5 is another exemplary block diagram illustrating a nonvolatile memory device according to some embodiments of the present disclosure.

FIG. 5 is another exemplary block diagram illustrating a nonvolatile memory device according to some embodiments of the present disclosure.

Referring to FIGS. 2 and 5, the last stage 800 of the nonvolatile memory device 100 includes a first bi-directional multiplexer 150, a second bi-directional multiplexer 160, a third register 213, a fourth register 215, a fifth register 223 and a sixth register 225, and a first I/O pad 230, a second I/O pad 240, a third I/O pad 250 and a fourth I/O pad 260.

For reference, the blocks associated with the clocks transmitted to each register are omitted from the drawings for convenience.

The third register 213 and the fourth register 215 may be connected to the first bi-directional multiplexer 150. The first I/O pad 230 may be connected to the third register 213. The second I/O pad 240 may be connected to the fourth register 215 (or the sub-register of the third register 213). The fifth register 223 and the sixth register 225 may be connected to the second bi-directional multiplexer 160. The third I/O pad 250 may be connected to the fifth register 223. The fourth I/O pad 260 may be connected to the sixth register 225 (or the sub-register of the fifth register 223).

In an alternative embodiment, the third register 213 and the fourth register 215 may together be considered a first register that includes the third register 213 as a first sub-register and the fourth register 215 as a second sub-register. In this alternative embodiment, the first I/O pad 230 and the second I/O pad 240 may together be considered a single first I/O pad, such that the third register 213 as the first sub-register is connected to a part of the single first I/O pad and such that the fourth register 215 as the second sub-register is connected to a remainder of the single first I/O pad.

Figure 9:
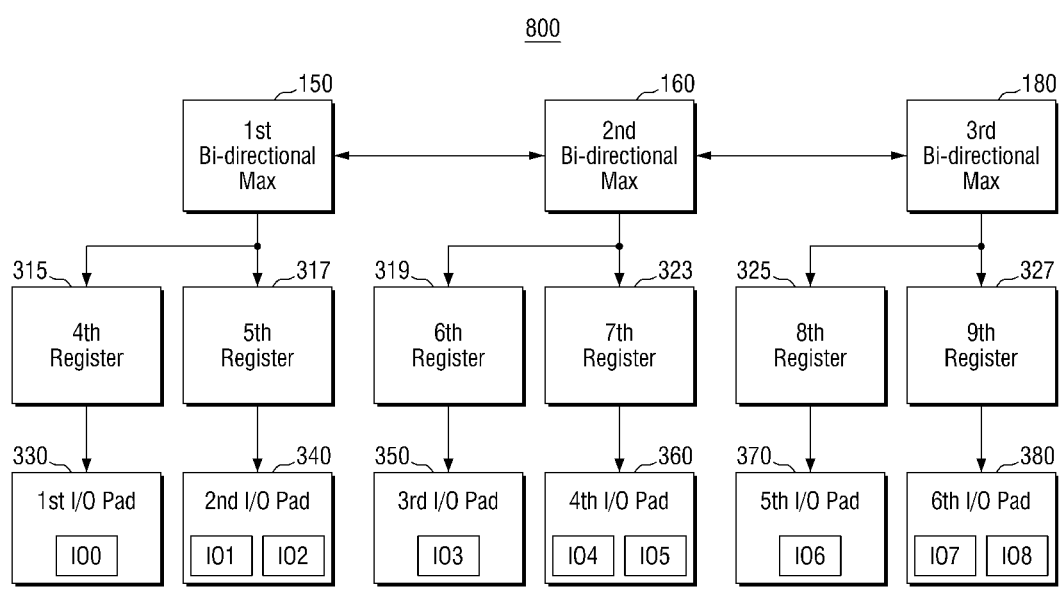
FIG. 9 is another exemplary block diagram illustrating a nonvolatile memory device according to some embodiments of the present disclosure.
Figure 10:
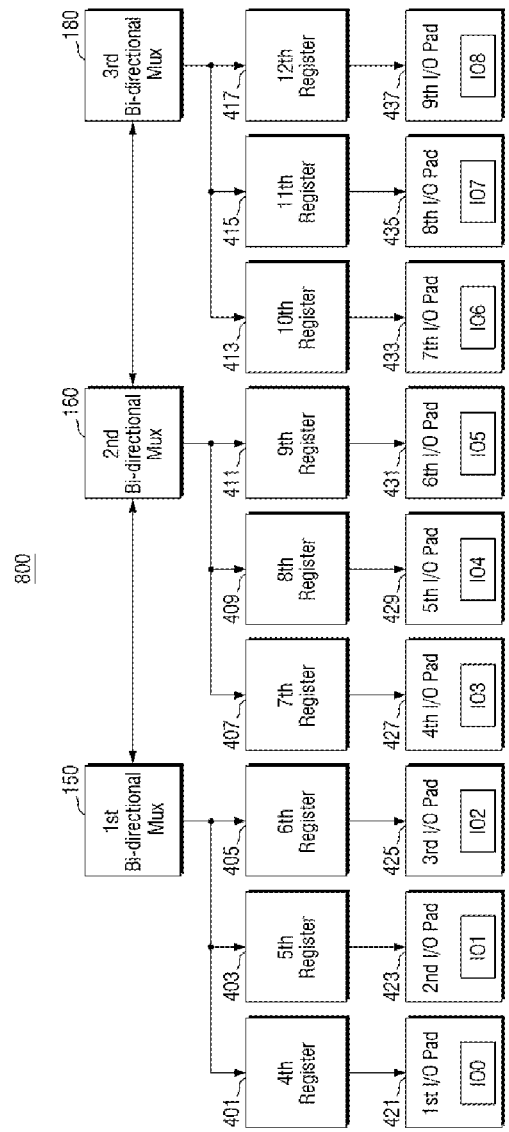
FIG. 10 is another exemplary block diagram illustrating a nonvolatile memory device according to some embodiments of the present disclosure.

In embodiments based on FIG. 5, FIG. 6, FIG. 7, FIG. 9 and/or FIG. 10, a number of registers is the same as the number of I/O pads, and the registers and the I/O pads are provided in one-to-one relationships. In FIG. 5, the third register 213 and the fourth register 215 may together be considered first registers, and the first I/O pad 230 and the second I/O pad 240 may together be considered first I/O pads. As such, the number of the first registers and the first I/O pads is the same in FIG. 5, and this can be visually confirmed for analogous arrangements in embodiments based directly on FIG. 6, on FIG. 7, on FIG. 9 and FIG. 10 also. Accordingly, such first registers and such first I/O pads are provided in one-to-one relationships in some embodiments herein. Similarly, in FIG. 6, the fifth register 223 and the sixth register 225 may together be considered second registers, and the third I/O pad 250 and the fourth I/O pad 260 may together be considered second I/O pads. As such, the number of the second registers and second I/O pads is the same in FIG. 5, and this can be visually confirmed for analogous arrangements in embodiments based directly on FIG. 6, on FIG. 7, on FIG. 9 and on FIG. 10. Accordingly, such second registers and such second I/O pads are provided in one-to-one relationships in some embodiments herein.

In the alternative embodiment noted above, the fifth register 223 and the sixth register 225 may together be considered a second register that includes the fifth register 223 as a third sub-register and the sixth register 225 as a fourth sub-register. In this alternative embodiment, the third I/O pad 250 and the fourth I/O pad 260 may together be considered a single second I/O pad, such that the fifth register 223 as a third sub-register is connected to a part of the single second I/O pad and such that the sixth register 225 as the fourth sub-register is connected to a remainder of the single second I/O pad. To be sure, this alternative embodiment is not restricted to only a first register and a second register each with two sub-registers, or a first I/O pad and a second I/O pad each with a part and a remainder. Rather, more than two registers may be provided with sub-register relationships, such as in alternatives based on the embodiments of FIG. 9 and FIG. 10 each with three groupings of registers that can be divided into sub-registers. Similarly, any grouped "register" is not limited to two sub-registers. Rather, more than two registers may be grouped as sub-registers of a single "register", such as in alternatives based on the embodiments of FIG. 6 with groups of four registers that can be grouped as sub-registers of a single "register", and with groupings of four I/O pads that can be grouped as parts of a single I/O pad.

A route which outputs the first data in the first plane 600 will be described.

The first sub-data of the first data in the first plane 600 may be transmitted to the third register 213 through the first bi-directional multiplexer 150. The first sub-data of the first data may be transmitted to the first I/O pad 230 through the third register 213. The first I/O pad 230 may include, but is not limited to, the first register IO0 and the second I/O register IO1.

The second sub-data of the first data in the first plane 600 may be transmitted to the fourth register 215 via the first bi-directional multiplexer 150. The second sub-data of the first data may be transmitted to the second I/O pad 240 via the fourth register 215. The second I/O pad 240 may include, but is not limited to, the third I/O register IO2 to the fourth I/O register IO3.

The third sub-data of the first data in the first plane 600 may be transmitted to the second bi-directional multiplexer 160 through the first bi-directional multiplexer 150. The third sub-data of the first data may be transmitted to the fifth register 223 via the second bi-directional multiplexer 160. The third sub-data of the first data may be transmitted to the third I/O pad 250 through the fifth register 223. The third I/O pad 250 may include, but is not limited to, the fifth I/O register IO4 to the sixth I/O register IO5.

The fourth sub-data of the first data in the first plane 600 may be transmitted to the second bi-directional multiplexer 160 through the first bi-directional multiplexer 150. The fourth sub-data of the first data may be transmitted to the sixth register 225 through the second bi-directional multiplexer 160. The fourth sub-data of the first data may be transmitted to the fourth I/O pad 260 through the sixth register 225. The fourth I/O pad 260 may include, but is not limited to, the seventh I/O register IO6 to the eighth I/O register IO7.

The third register 213, the fourth register 215, the fifth register 223 and the sixth register 225 may operate in the HF (High Frequency) region, and a skew may occur between the first data and the clock signals to be input to the third register 213, the fourth register 215, the fifth register 223 and the sixth register 225. Therefore, by shortening the data transmission distance between the first I/O pad 230, the second I/O pad 240, the third I/O pad 250 and the fourth I/O pad 260 and the third register 213, the fourth register 215, the fifth register 223 and the sixth register 225, it is possible to reduce the possibility of occurrence or magnitude of skew, thereby enabling the high-speed operation of the nonvolatile memory device 100.

For example, a case where the first data is output up to the first I/O pad 230, the second I/O pad 240, the third I/O pad 250 and the fourth I/O pad 260 using one multiplexer and one register can be readily contrasted with embodiments based on FIG. 5. In this case, the route through which the first data travels to the first I/O pad 230, the second I/O pad 240, the third I/O pad 250 and the fourth I/O pad 260 arranged left and right through the single register operating with HF is longer than the last stage 800 of FIG. 5.

That is, by arranging the third register 213, the fourth register 215, the fifth register 223 and the sixth register 225 in one-to-one relationships with each of the first I/O pad 230, the second I/O pad 240, the third I/O pad 250 and the fourth I/O pad 260, it is possible to reduce the route of the first data operating with HF, thereby reducing the possibility of occurrence or magnitude of skew and enabling the high-speed operation of the nonvolatile memory device 100.

A route which outputs the second data in the second plane 700 will be described.

The first sub-data of the second data in the second plane 700 may be transmitted to the sixth register 225 through the second bi-directional multiplexer 160. The first sub-data of the second data may be transmitted to the fourth I/O pad 260 through the sixth register 225. The fourth I/O pad 260 may include, but is not limited to, the seventh I/O register IO6 to the eighth I/O register IO7.

The second sub-data of the second data in the second plane 700 may be transmitted to the fifth register 223 through the second bi-directional multiplexer 160. The second sub-data of the second data may be transmitted to the third I/O pad 250 through the fifth register 223. The third I/O pad 250 may include, but is not limited to, the fifth I/O register IO4 to the sixth I/O register IO5.

The third sub-data of the second data in the second plane 700 may be transmitted to the first bi-directional multiplexer 150 through the second bi-directional multiplexer 160. The third sub-data of the second data may be transmitted to the fourth register 215 through the first bi-directional multiplexer 150. The third sub-data of the second data may be transmitted to the second I/O pad 240 through the fourth register 215. The second I/O pad 240 may include, but is not limited to, the third I/O register IO3 to fourth I/O register IO4.

The fourth sub-data of the second data in the second plane 700 may be transmitted to the first bi-directional multiplexer 150 through the second bi-directional multiplexer 160. The fourth sub-data of the second data may be transmitted to the third register 213 through the first bi-directional multiplexer 150. The fourth sub-data of the second data may be transmitted to the first I/O pad 230 through the third register 213. The first I/O pad 230 may include, but is not limited to, the first I/O register IO1 to the second I/O register IO2.

The third register 213, the fourth register 215, the fifth register 223 and the sixth register 225 may operate in the HF (High Frequency) region, and a skew may occur between the second data and the clock signals to be input to the third register 213, the fourth register 215, the fifth register 223 and the sixth register 225. Therefore, by shortening the data transmission distance between the first I/O pad 230, the second I/O pad 240, the third I/O pad 250 and the fourth I/O pad 260 and the third register 213, the fourth register 215, the fifth register 223 and the sixth register 225, it is possible to reduce the possibility of occurrence or magnitude of skew, thereby enabling the high-speed operation of the nonvolatile memory device 100.

For example, a case where the second data is output up to the first I/O pad 230, the second I/O pad 240, the third I/O pad 250 and the fourth I/O pad 260, using one multiplexer and one register can be readily contrasted with embodiments based on FIG. 5. In this case, the route through which the second data travels to the first I/O pad 230, the second I/O pad 240, the third I/O pad 250 and the fourth I/O pad 260 arranged on the left and right via a single register operating with HF is longer than the last stage 800 of FIG. 5.

That is, by arranging the third register 213, the fourth register 215, the fifth register 223 and the sixth register 225 in one-to-one relationships with each of the first I/O pad 230, the second I/O pad 240, the third I/O pad 250 and the fourth I/O pad 260, it is possible to reduce the route of second data operating with HF, thereby reducing the possibility of occurrence or magnitude of skew and enabling the high-speed operation of the nonvolatile memory device 100.

Figure 6:
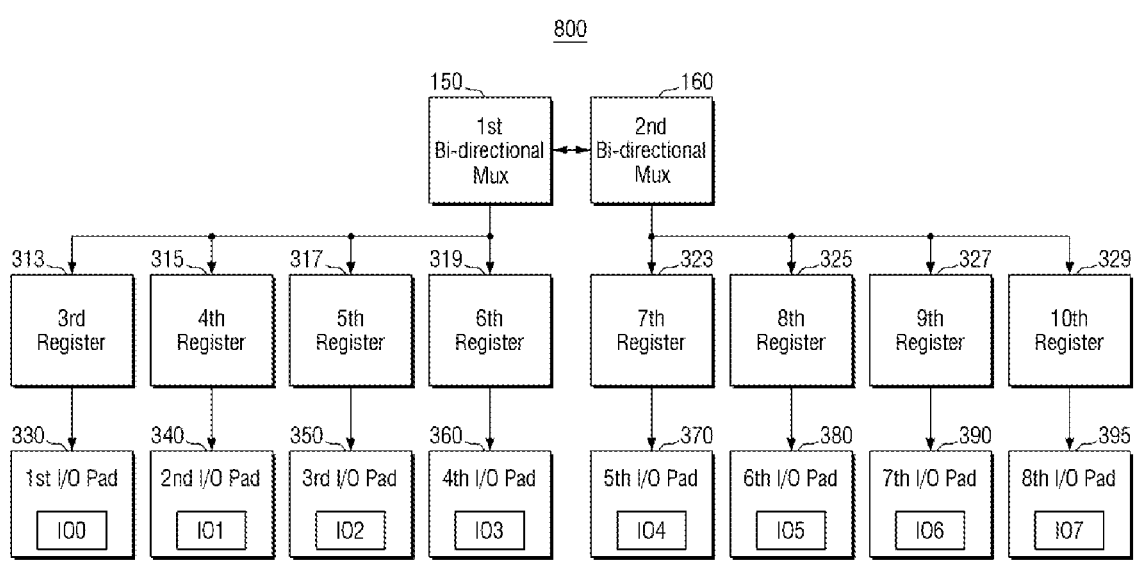
FIG. 6 is another exemplary block diagram illustrating a nonvolatile memory device according to some embodiments of the present disclosure.

FIG. 6 is another exemplary block diagram illustrating a nonvolatile memory device according to some embodiments of the present disclosure.

Referring to FIGS. 2 and 6, the last stage 800 of the nonvolatile memory device 100 includes a first bi-directional multiplexer 150, a second bi-directional multiplexer 160, third register 313, fourth register 315, fifth register 317, sixth register 319, seventh register 323, eighth register 325, ninth register 327 and tenth register 329, and first I/O pad 330, second I/O pad 340, third I/O pad 350, fourth I/O pad 360, fifth I/O pad 370, sixth I/O pad 380, seventh I/O pad 390 and eighth I/O pad 395.

For reference, the blocks associated with the clocks transmitted to each register are omitted from the drawing for convenience.

The third register 313, the fourth register 315, the fifth register 317 and the sixth register 319 may be connected to the first bi-directional multiplexer 150. The first I/O pad 330 may be connected to the third register 313. The second I/O pad 340 may be connected to the fourth register 315. The third I/O pad 350 may be connected to the fifth register 317. The fourth I/O pad 360 may be connected to the sixth register 319. The seventh register 323, eighth register 325, ninth register 327 and tenth register 329 may be connected to the second bi-directional multiplexer 160. The fifth I/O pad 370 may be connected to the seventh register 323. The sixth I/O pad 380 may be connected to the eighth register 325. The seventh I/O pad 390 may be connected to the ninth register 327. The eighth I/O pad 395 may be connected to the tenth register 329.

A route which outputs the first data in the first plane 600 will be described.

The first sub-data of the first data in the first plane 600 may be transmitted to the third register 313 through the first bi-directional multiplexer 150. The first sub-data of the first data may be transmitted to the first I/O pad 330 through the third register 313. The first I/O pad 330 may include, but is not limited to, the first I/O register IO0.

The second sub-data of the first data in the first plane 600 may be transmitted to the fourth register 315 through the first bi-directional multiplexer 150. The second sub-data of the first data may be transmitted to the second I/O pad 340 through the fourth register 315. The second I/O pad 340 may include, but is not limited to, the second I/O register IO1.

The third sub-data of the first data in the first plane 600 may be transmitted to the fifth register 317 through the first bi-directional multiplexer 150. The third sub-data of the first data may be transmitted to the third I/O pad 350 through the fifth register 317. The third I/O pad 350 may include, but is not limited to, the third I/O register IO2.

The fourth sub-data of the first data in the first plane 600 may be transmitted to the sixth register 319 through the first bi-directional multiplexer 150. The fourth sub-data of the first data may be transmitted to the fourth I/O pad 360 through the sixth register 319. The fourth I/O pad 360 may include, but is not limited to, the fourth I/O register IO3.

The fifth sub-data of the first data in the first plane 600 may be transmitted to the second bi-directional multiplexer 160 through the first bi-directional multiplexer 150. The fifth sub-data of the first data may be transmitted to the seventh register 323 through the second bi-directional multiplexer 160. The fifth sub-data of the first data may be transmitted to the fifth I/O pad 370 through the seventh register 323. The fifth I/O pad 370 may include, but is not limited to, the fifth I/O register IO4.

The sixth sub-data of the first data in the first plane 600 may be transmitted to the second bi-directional multiplexer 160 through the first bi-directional multiplexer 150. The sixth sub-data of the first data may be transmitted to the eighth register 325 through the second bi-directional multiplexer 160. The sixth sub-data of the first data may be transmitted to the sixth I/O pad 380 through the eighth register 325. The sixth I/O pad 380 may include, but is not limited to, a sixth I/O register IO5.

The seventh sub-data of the first data in the first plane 600 may be transmitted to the second bi-directional multiplexer 160 through the first bi-directional multiplexer 150. The seventh sub-data of the first data may be transmitted to the ninth register 327 through the second bi-directional multiplexer 160. The seventh sub-data of the first data may be transmitted to the seventh I/O pad 390 through the ninth register 327. The seventh I/O pad 390 may include, but is not limited to, a seventh I/O register IO6.

The eighth sub-data of the first data in the first plane 600 may be transmitted to the second bi-directional multiplexer 160 through the first bi-directional multiplexer 150. The eighth sub-data may be transmitted to the tenth register 329 through the second bi-directional multiplexer 160. The eighth sub-data may be transmitted to the eighth I/O pad 395 through the tenth register 329. The eighth I/O pad 395 may include, but is not limited to, the eighth I/O register IO7.

The third register 313, fourth register 315, fifth register 317, sixth register 319, seventh register 323, eighth register 325, ninth register 327 and tenth register 329 may operate in the HF (High Frequency) region, and a skew may occur between the first data and the clock signals to be input to the third register 313, fourth register 315, fifth register 317, sixth register 319, seventh register 323, eighth register 325, ninth register 327 and tenth register 329. Therefore, by shortening the data transmission distance between the first I/O pad 330, second I/O pad 340, third I/O pad 350, fourth I/O pad 360, fifth I/O pad 370, sixth I/O pad 380, seventh I/O pad 390 and eighth I/O pad 395 and the third register 313, fourth register 315, fifth register 317, sixth register 319, seventh register 323, eighth register 325, ninth register 327 and tenth register 329, it is possible to reduce the possibility of occurrence or magnitude of skew, thereby enabling the high-speed operation of the nonvolatile memory device 100.

For example, a case where the first data is output up to the first I/O pad 330, second I/O pad 340, third I/O pad 350, fourth I/O pad 360, fifth I/O pad 370, sixth I/O pad 380, seventh I/O pad 390 and eighth I/O pad 395, using one multiplexer and one register can be readily contrasted with embodiments based on FIG. 6. In this case, the route through which the first data travels to the first I/O pad 330, second I/O pad 340, third I/O pad 350, fourth I/O pad 360, fifth I/O pad 370, sixth I/O pad 380, seventh I/O pad 390 and eighth I/O pad 395 arranged on the left and right through a single register operating with HF is longer than the last stage 800 of FIG. 6.

That is, by arranging third register 313, fourth register 315, fifth register 317, sixth register 319, seventh register 323, eighth register 325, ninth register 327 and tenth register 329 in one-to-one relationships with each of the first I/O pad 330, second I/O pad 340, third I/O pad 350, fourth I/O pad 360, fifth I/O pad 370, sixth I/O pad 380, seventh I/O pad 390 and eighth I/O pad 395, it is possible to reduce the route of the first data operating with the HF, thereby reducing the possibility of occurrence or magnitude of the skew and enabling the high-speed operation of the nonvolatile memory device 100.

Since the route which outputs the second data in the second plane 700 is symmetrical with the route which outputs the first data in the first plane 600, the explanation thereof will not be provided.

Figure 7:
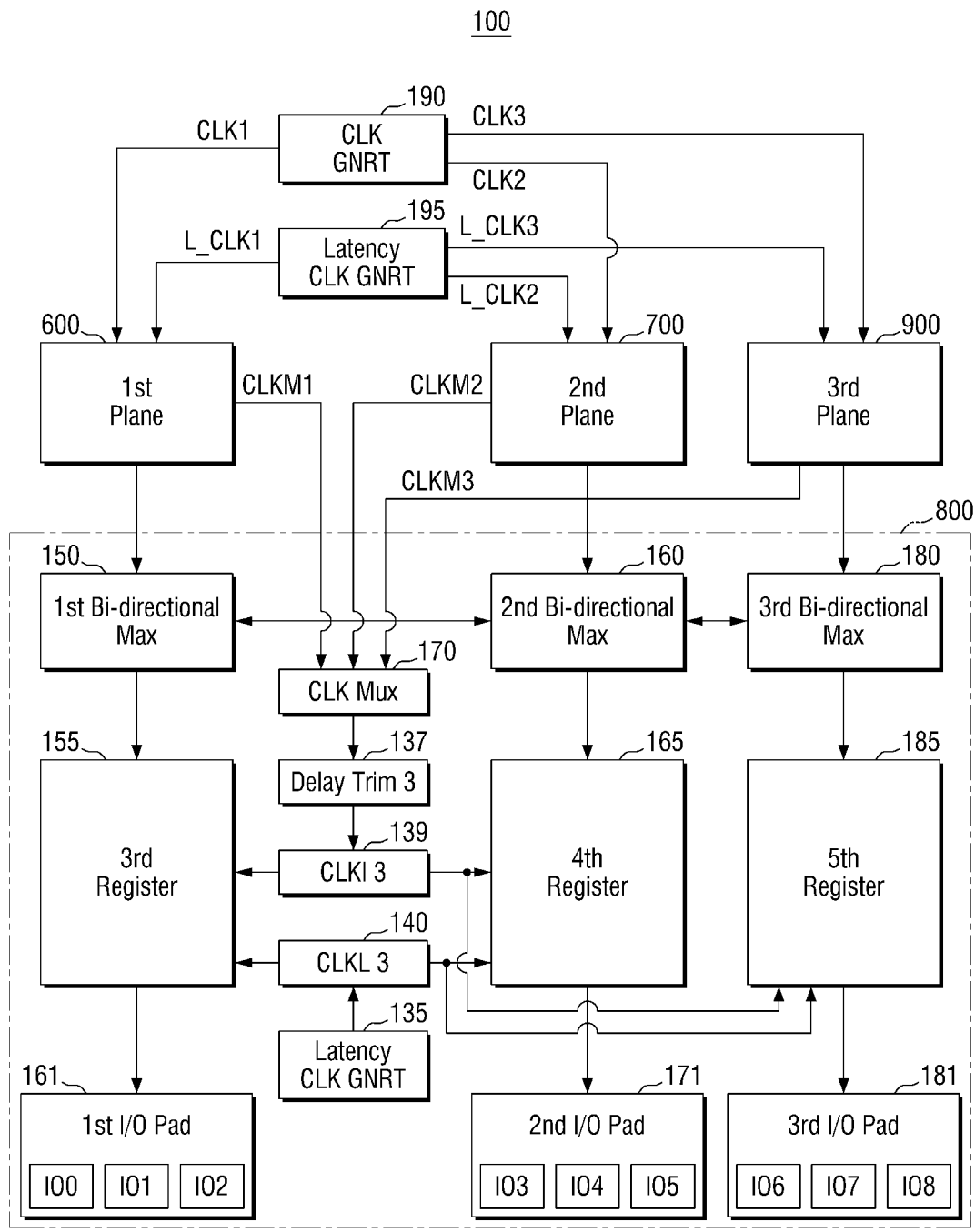
FIG. 7 is another exemplary block diagram illustrating the nonvolatile memory device of FIG. 1.
Figure 8:
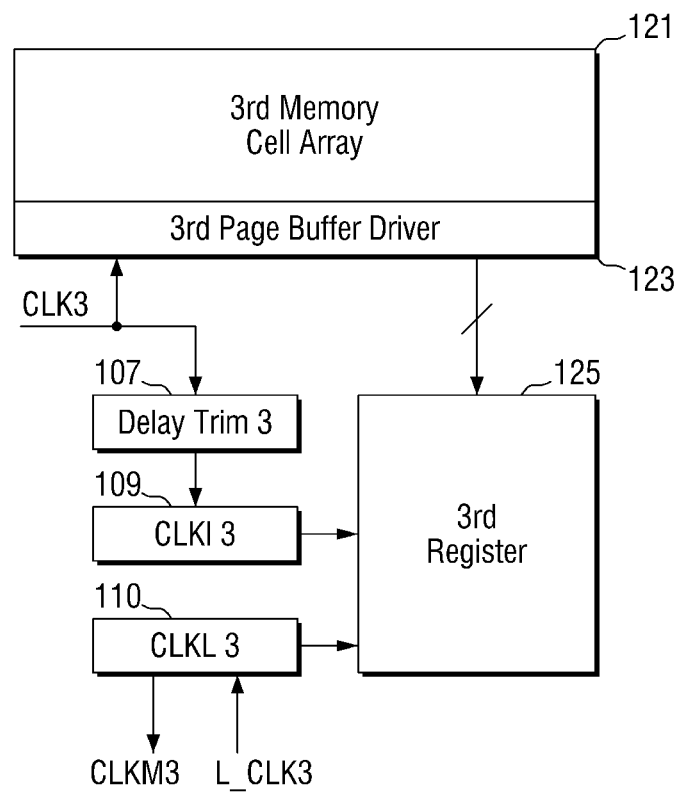
FIG. 8 is an exemplary block diagram illustrating a third plane of FIG. 7.

FIG. 7 is another exemplary block diagram illustrating the nonvolatile memory device of FIG. 1. FIG. 8 is an exemplary block diagram illustrating the third plane of FIG. 7.

For reference, the repeated parts of the description of FIG. 2 will be omitted, and the third plane 900 will be mainly described.

Referring to FIGS. 7 and 8, the nonvolatile memory device 100 further includes a third plane 900, a third bi-directional multiplexer 180, a fifth register 185, and a third I/O pad 181, as compared to the nonvolatile memory device 100 of FIG. 2. The third plane 900 includes a third memory cell array 121, a third page buffer driver 123, a third delay trim 127, a third clock input 129, a third clock latency input 130, and a third register 125.

Although the third plane 900 is an exemplary block diagram using the wave pipeline system, the configuration of the third plane 900 is not limited thereto.

When an output command of the third data in the third memory cell array 121 is input, the third data is transmitted from the third memory cell array 121 to the third register 125 via the third page buffer driver 123. The third data may be parallel data that is transmitted or otherwise processed in parallel with other data such as first data and/or second data. The transmission scheme of the third data is not limited thereto.

The third data which are output from the third memory cell array 121 may be stored in the third register 125 in synchronization with the third clock signal CLK3 generated by the clock generator 190. The third clock signal CLK3 may be transmitted to the third register 125 via the third delay trim 127 and the third clock input 129, but the transmission scheme is not limited thereto. Further, a third latency clock signal L_CLK3 transmitted through the latency clock generator 195 for a delay control may be imparted (communicated) to the third register 125. The third latency clock signal L_CLK3 may be transmitted to the third register 125 via the third clock latency input 130. The third clock latency input 130 may transmit the third clock multiplexer signal CLKM3 to the clock multiplexer 170.

A route which outputs the third data in the third plane 900 will be described referring again to FIG. 7.

When outputting the third data in the third plane 900, the third clock multiplexer signal CLKM3 may be transmitted from the clock multiplexer 170 to the third register 155, the fourth register 165, and the fifth register 185 through the third delay trim 137 and the third clock input 139. The transmission scheme of the third clock multiplexer signal CLKM3 is not limited thereto. Also, the latency signal may be transmitted from the latency clock generator 195 to the third register 155, the fourth register 165 and the fifth register 185 through the third clock latency input 140 for a latency control. The clock input scheme according to the wave pipeline structure is not limited thereto.

The first sub-data of the third data in the third plane 900 may be transmitted to the fifth register 185 through the third bi-directional multiplexer 180. The first sub-data of the third data may be transmitted to the third I/O pad 181 through the fifth register 185. The third I/O pad 181 may include, but is not limited to, the seventh I/O register IO6, the eighth I/O register IO7 and the ninth I/O register 108.

Also, the second sub-data of the third data in the third plane 900 may be transmitted to the second bi-directional multiplexer 160 through the third bi-directional multiplexer 180. The second sub-data of the third data may be transmitted to the fourth register 165 through the second bi-directional multiplexer 160. The second sub-data of the third data may be transmitted to the second I/O pad 171 through the fourth register 165. The second I/O pad 171 may include, but it is not limited to, the fourth I/O register I/O3 through sixth I/O register IO5.

Finally, the third sub-data of the third data in the third plane 900 may be transmitted to the second bi-directional multiplexer 160 through the third bi-directional multiplexer 180. Thereafter, the third sub-data of the third data may be transmitted to the first bi-directional multiplexer 150 through the second bi-directional multiplexer 160. The third sub-data of the third data may be transmitted to the third register 155 through the first bi-directional multiplexer 150. The third sub-data of the third data may be transmitted to the first I/O pad 161 through the third register 155. The first I/O pad 161 may include, but is not limited to, the first I/O register I/O0 through third I/O register IO2.

The third register 155, the fourth register 165 and the fifth register 185 may operate in the HF (High Frequency) region, and a skew may occur between the third data and the clock signals transmitted through third clock input 139 and/or the third clock latency input 140. Therefore, by shortening the data transmission distance between the first I/O pad 161, the second I/O pad 171 and the third I/O pad 181 and the third register 155, the fourth register 165 and the fifth register 185, it is possible to reduce a possibility of occurrence or magnitude of skew, thereby enabling the high-speed operation of the nonvolatile memory device 100.

For example, a case where the third data is output up to the first I/O pad 161, the second I/O pad 171 and the third I/O pad 181, using one multiplexer and one register can be readily contrasted with embodiments based on FIG. 7 and FIG. 8. In this case, the route through which the third data travels to the first I/O pad 161, the second I/O pad 171 and the third I/O pad 181 arranged on the left and right through a single register operating with the HF is longer than the last stage 800 of FIG. 7.

That is, by arranging the third register 155, the fourth register 165 and the fifth register 185 in one-to-one relationships with each of the first I/O pad 161, the second I/O pad 171 and the third I/O pad 181, it is possible to reduce the route of the third data operating with the HF, thereby reducing the possibility of occurrence or magnitude of skew and enabling the high-speed operation of the nonvolatile memory device 100.

FIG. 9 is an exemplary block diagram illustrating a nonvolatile memory device according to some embodiments of the present disclosure.

Referring to FIGS. 7 and 9, the last stage 800 of the nonvolatile memory device 100 includes a first bi-directional multiplexer 150, a second bi-directional multiplexer 160, a third bi-directional multiplexer 180, fourth register 315, fifth register 317, sixth register 319, seventh register 323, eighth register 325 and ninth register 327 and first I/O pad 330, second I/O pad 340, third I/O pad 350, fourth I/O pad 360, fifth I/O pad 370 and sixth I/O pad 380.

For reference, the blocks associated with the clocks transmitted to each register are omitted from the drawing for convenience.

The fourth register 315 and the fifth register 317 may be connected to the first bi-directional multiplexer 150. The first I/O pad 330 may be connected to the fourth register 315. The second I/O pad 340 may be connected to the fifth register 317. The sixth register 319 and the seventh register 323 may be connected to the second bi-directional multiplexer 160. The third I/O pad 350 may be connected to the sixth register 319. The fourth I/O pad 360 may be connected to the seventh register 323. The eighth register 325 and the ninth register 328 may be connected to the third bi-directional multiplexer 180. The fifth I/O pad 370 may be connected to the eighth register 325. The sixth I/O pad 380 may be connected to the ninth register 327.

A route which outputs the first data in the first plane 600 will be described.

The first sub-data of the first data in the first plane 600 may be transmitted to the fourth register 315 through the first bi-directional multiplexer 150. The first sub-data of the first data may be transmitted to the first I/O pad 330 through the fourth register 315. The first I/O pad 330 may include, but is not limited to, the first I/O register IO0.

The second sub-data of the first data in the first plane 600 may be transmitted to the fifth register 317 through the first bi-directional multiplexer 150. The second sub-data of the first data may be transmitted to the second I/O pad 340 through the fifth register 317. The second I/O pad 340 may include, but is not limited to, the second I/O register IO1 and the third I/O register IO2.

The third sub-data of the first data in the first plane 600 may be transmitted to the first bi-directional multiplexer 150. Thereafter, the third sub-data of the first data may be transmitted to the second bi-directional multiplexer 160 through the first bi-directional multiplexer 150. The third sub-data of the first data may be transmitted from the second bi-directional multiplexer 160 to the sixth register 319. The third sub-data of the first data may be transmitted to the third I/O pad 350 through the sixth register 319. The third I/O pad 350 may include, but is not limited to, the fourth I/O register IO3.

The fourth sub-data of the first data in the first plane 600 may be transmitted to the first bi-directional multiplexer 150. Thereafter, the fourth sub-data of the first data may be transmitted to the second bi-directional multiplexer 160 through the first bi-directional multiplexer 150. The fourth sub-data of the first data may be transmitted from the second bi-directional multiplexer 160 to the seventh register 323. The fourth sub-data of the first data may be transmitted to the fourth I/O pad 360 through the seventh register 323. The fourth I/O pad 360 may include, but is not limited to, the fifth I/O register IO4 and the sixth I/O register IO5.

The fifth sub-data of the first data in the first plane 600 may be transmitted to the first bi-directional multiplexer 150. Thereafter, the fifth sub-data of the first data may be transmitted to the second bi-directional multiplexer 160 through the first bi-directional multiplexer 150. Further, the fifth sub-data of the first data may be transmitted to the third bi-directional multiplexer 180 through the second bi-directional multiplexer 160. The fifth sub-data of the first data may be transmitted from the third bi-directional multiplexer 180 to the eighth register 325. The fifth sub-data of the first data may be transmitted to the fifth I/O pad 370 through the eighth register 325. The fifth I/O pad 370 may include, but is not limited to, the seventh I/O register IO6.

The sixth sub-data of the first data in the first plane 600 may be transmitted to the first bi-directional multiplexer 150. Thereafter, the sixth sub-data of the first data may be transmitted to the second bi-directional multiplexer 160 through the first bi-directional multiplexer 150. Further, the sixth sub-data of the first data may be transmitted to the third bi-directional multiplexer 180 through the second bi-directional multiplexer 160. The sixth sub-data of the first data may be transmitted from the third bi-directional multiplexer 180 to the ninth register 327. The sixth sub-data of the first data may be transmitted to the sixth I/O pad 380 through the ninth register 327. The sixth I/O pad 380 may include, but is not limited to, the eighth I/O register IO7 and the ninth I/O register 108.

The fourth register 315, fifth register 317, sixth register 319, seventh register 323, eighth register 325 and ninth register 327 may operate in the HF (High Frequency) region, and a skew may occur between the first data and the clock signals to be input to the fourth register 315, fifth register 317, sixth register 319, seventh register 323, eighth register 325 and ninth register 327. Therefore, by shortening the data transmission distance between the first I/O pad 330, second I/O pad 340, third I/O pad 350, fourth I/O pad 360, fifth I/O pad 370 and sixth I/O pad 380 and the fourth register 315, fifth register 317, sixth register 319, seventh register 323, eighth register 325 and ninth register 327, it is possible to reduce the possibility of occurrence or magnitude of skew, thereby enabling the high-speed operation of the nonvolatile memory device 100.

For example, a case where the first data is output to the first I/O pad 330, second I/O pad 340, third I/O pad 350, fourth I/O pad 360, fifth I/O pad 370 and sixth I/O pad 380, using one multiplexer and one register can be readily contrasted with embodiments based on FIG. 9. In this case, the route through which the first data travels to the first I/O pad 330, second I/O pad 340, third I/O pad 350, fourth I/O pad 360, fifth I/O pad 370 and sixth I/O pad 39—arranged on the left and right through a single register operating with HF is longer than the last stage 800 of FIG. 7.

That is, by arranging the fourth register 315, fifth register 317, sixth register 319, seventh register 323, eighth register 325 and ninth register 327 in one-to-one relationships with each of the first I/O pad 330, second I/O pad 340, third I/O pad 350, fourth I/O pad 360, fifth I/O pad 370 and sixth I/O pad 380, it is possible to reduce the route of the first data operating with the HF, thereby reducing the possibility of occurrence or magnitude of skew, and enabling the high-speed operation of the nonvolatile memory device 100.

Since the output route of the second data in the second plane 700 and the third data in the third plane 900 is symmetrical with the output route of the first data in the first plane 600, description thereof will not be provided.

In an alternative embodiment similar to the alternative embodiments noted above relative to FIG. 5, the fourth register 315 and the fifth register 317 may together be considered a first register that includes the fourth register 315 as a first sub-register and the fifth register 317 as a second sub-register. The sixth register 319 and the seventh register 323 may together be considered a second register that includes the sixth register 319 as a third sub-register and the seventh register 323 as a fourth sub-register. The eighth register 325 and the ninth register 327 may together be considered a third register that includes the eighth register 325 as a fifth sub-register and the ninth register 327 as a sixth sub-register. In this alternative embodiment, the first I/O pad 330 and the second I/O pad 340 may together be considered a single first I/O pad, such that the fourth register 315 as a first sub-register is connected to a part of the single first I/O pad and such that the fifth register 317 as a second sub-register is connected to a remainder of the single first I/O pad. The third I/O pad 350 and the fourth I/O pad 360 may together be considered a single second I/O pad, such that the sixth register 319 as the third sub-register is connected to a part of the single second I/O pad and such that the seventh register 323 as the fourth sub-register is connected to a remainder of the single second I/O pad. The fifth I/O pad 370 and the sixth I/O pad 380 may together be considered a single third I/O pad, such that the eighth register 325 as the fifth sub-register is connected to a part of the single third I/O pad and such that the ninth register 327 as the sixth sub-register is connected to a remainder of the single third I/O pad. This alternative embodiment is also not restricted to only three registers each with two sub-registers, or three I/O pads each with a part and a remainder. Rather, more than two registers may be provided with sub-register relationships, and more than two I/O pads may be provided. Similarly, any grouping of sub-registers of a "register" is not limited to two sub-registers. Rather, more than two registers may be grouped as sub-registers of a single "register".

FIG. 10 is another exemplary block diagram illustrating a nonvolatile memory device according to some embodiments of the present disclosure.

Referring to FIGS. 7 and 10, the last stage 800 of the nonvolatile memory device 100 includes a first bi-directional multiplexer 150, a second bi-directional multiplexer 160, a third bi-directional multiplexer 180, fourth register 401, fifth register 403, sixth register 405, seventh register 407, eighth register 409, ninth register 411, tenth register 413, eleventh register 415 and twelfth register 417, and first I/O pad 421, second I/O pad 423, third I/O pad 425, fourth I/O pad 427, fifth I/O pad 429, sixth I/O pad 431, seventh I/O pad 433, eighth I/O pad 435 and ninth I/O pad 437.

For reference, the blocks associated with the clocks transmitted to each register are omitted from the drawing for convenience.

The fourth register 401, fifth register 403 and sixth register 405 may be connected to the first bi-directional multiplexer 150. A first I/O pad 421 may be connected to the fourth register 401. A second I/O pad 423 may be connected to the fifth register 403. A third I/O pad 425 may be connected to the sixth register 404. The seventh register 407, eighth register 409 and ninth register 411 may be connected to the second bi-directional multiplexer 160. A fourth I/O pad 427 may be connected to the seventh register 407. A fifth I/O pad 429 may be connected to the eighth register 409. A sixth I/O pad 431 may be connected to the ninth register 411. The tenth register 413, eleventh register 415 and twelfth register 417 may be connected to the third bi-directional multiplexer 180. A seventh I/O pad 433 may be connected to the tenth register 413. An eighth I/O pad 435 may be connected to the eleventh register 415. A ninth I/O pad 437 may be connected to the twelfth register 417.

A route which outputs the first data in the first plane 600 will be described.

The first sub-data of the first data in the first plane 600 may be transmitted to the fourth register 401 through the first bi-directional multiplexer 150. The first sub-data of the first data may be transmitted to the first I/O pad 421 via the fourth register 401. The first I/O pad 421 may include, but is not limited to, the first I/O register IO0.

The second sub-data of the first data in the first plane 600 may be transmitted to the fifth register 403 through the first bi-directional multiplexer 150. The second sub-data of the first data may be transmitted to the second I/O pad 423 through the fifth register 403. The second I/O pad 423 may include, but is not limited to, the second I/O register IO1.

The third sub-data of the first data in the first plane 600 may be transmitted to the sixth register 405 through the first bi-directional multiplexer 150. The third sub-data of the first data may be transmitted to the third I/O pad 425 through the sixth register 405. The third I/O pad 425 may include, but is not limited to, a third I/O register IO2.

The fourth sub-data through sixth sub-data of the first data in the first plane 600 may be transmitted to the first bi-directional multiplexer 150. Thereafter, the fourth sub-data through sixth sub-data of the first data may be transmitted to the second bi-directional multiplexer 160 through the first bi-directional multiplexer 150. The fourth sub-data of the first data may be transmitted from the second bi-directional multiplexer 160 to the seventh register 407. The fourth sub-data of the first data may be transmitted to the fourth I/O pad 427 through the seventh register 407. The fourth I/O pad 427 may include, but is not limited to, the fourth I/O register IO3. The fifth sub-data of the first data may be transmitted from the second bi-directional multiplexer 160 to the eighth register 409. The fifth sub-data of the first data may be transmitted to the fifth I/O pad 429 through the eighth register 409. The fifth I/O pad 429 may include, but is not limited to, the fifth I/O register IO4. The sixth sub-data of the first data may be transmitted from the second bi-directional multiplexer 160 to the ninth register 411. The sixth sub-data of the first data may be transmitted to the sixth I/O pad 431 through the ninth register 411. The sixth I/O pad 431 may include, but is not limited to, the sixth I/O register IO5.

The seventh sub-data through ninth sub-data of the first data in the first plane 600 may be transmitted to the first bi-directional multiplexer 150. Thereafter, the seventh sub-data, the eighth sub-data and the ninth sub-data of the first data may be transmitted to the second bi-directional multiplexer 160 through the first bi-directional multiplexer 150. Also, the seventh sub-data through ninth sub-data of the first data may be transmitted to the third bi-directional multiplexer 180 through the second bi-directional multiplexer 160. The seventh sub-data of the first data may be transmitted from the third bi-directional multiplexer 180 to the tenth register 413. The seventh sub-data of the first data may be transmitted to the seventh I/O pad 433 through the tenth register 413. The seventh I/O pad 433 may include, but is not limited to, a seventh I/O register IO6. The eighth sub-data of the first data may be transmitted from the third bi-directional multiplexer 180 to the eleventh register 415. The eighth sub-data of the first data may be transmitted to the eighth I/O pad 435 through the eleventh register 415. The eighth I/O pad 435 may include, but is not limited to, an eighth I/O register IO7. The ninth sub-data of the first data may be transmitted from the third bi-directional multiplexer 180 to the twelfth register 417. The ninth sub-data of the first data may be transmitted to the ninth I/O pad 437 through the twelfth register 417. The ninth I/O pad 437 may include, but is not limited to, a ninth I/O register 108.

The fourth register 401, fifth register 403, sixth register 405, seventh register 407, eighth register 409, ninth register 411, tenth register 413, eleventh register 415 and twelfth register 417 may operate in the HF (High Frequency) region, and a skew may occur between the clock signals to be input to the fourth register 401, fifth register 403, sixth register 405, seventh register 407, eighth register 409, ninth register 411, tenth register 413, eleventh register 415 and twelfth register 417. Therefore, by shortening the data transmission distance between the first I/O pad 421, second I/O pad 423, third I/O pad 425, fourth I/O pad 427, fifth I/O pad 429, sixth I/O pad 431, seventh I/O pad 433, eighth I/O pad 435 and ninth I/O pad 437 and the fourth register 401, fifth register 403, sixth register 405, seventh register 407, eighth register 409, ninth register 411, tenth register 413, eleventh register 415 and twelfth register 417, it is possible to reduce the possibility of occurrence or magnitude of skew, thereby enabling the high-speed operation of the nonvolatile memory device 100.

For example, a case where the first data is output up to the first I/O pad 421, second I/O pad 423, third I/O pad 425, fourth I/O pad 427, fifth I/O pad 429, sixth I/O pad 431, seventh I/O pad 433, eighth I/O pad 435 and ninth I/O pad 437 using one multiplexer and one register will be described. In this case, the route through which the first data travels to the first I/O pad 421, second I/O pad 423, third I/O pad 425, fourth I/O pad 427, fifth I/O pad 429, sixth I/O pad 431, seventh I/O pad 433, eighth I/O pad 435 and ninth I/O pad 437 arranged on the left and right through a single register operating with HF is longer than the last stage 800 of FIG. 7.

That is, by arranging the fourth register 401, the fifth register 403, the sixth register 405, the seventh register 407, the eighth register 409, the ninth register 411, the tenth register 413, the eleventh register 415 and the twelfth register 417 in one-to-one relationships with each of the first I/O pad 421, the second I/O pad 423, the third I/O pad 425, the fourth I/O pad 427, the fifth I/O pad 429, the sixth I/O pad 431, the seventh I/O pad 433, the eighth I/O pad 435 and the ninth I/O pad 437, it is possible to reduce the route of the first data operating with the HF, thereby reducing the possibility of occurrence or magnitude of skew, and enabling the high-speed operation of the nonvolatile memory device 100.

Since the output path of the second data in the second plane 700 and the third data in the third plane 900 is symmetrical with the output route of the first data in the first plane 600, description thereof will not be provided.

FIG. 11 is a block diagram illustrating a computing system including the nonvolatile memory device according to some embodiments of the present disclosure.

Referring to FIG. 11, a computing system 1000 includes a CPU 1100 (central processing unit), a RAM (Random Access Memory) 1200, a user interface 1300, a power supply 1400, and a storage device 1.

The data processed by the CPU 1100 may be stored in the storage device 1 via the system bus 1500.

The computing system 1000 may be provided as one of various components of an electronic device, such as a computer, an UMPC (Ultra Mobile PC), a workstation, a net-book, a PDA (Personal Digital Assistants), a portable computer, a web tablet, a wireless phone, a mobile phone, a smart phone, an e-book, a PMP (portable multimedia player), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices constituting a home network, one of various electronic devices constituting a computer network, one of various electronic devices constituting a telematics network, an RFID device, or one of various components constituting a computing system, but the present disclosure is not limited to such exemplification.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A nonvolatile memory device, comprising:
a first memory cell array which stores first data;
a first bi-directional multiplexer which receives the first data and distributes the first data into first sub-data and second sub-data;
a second bi-directional multiplexer which receives the second sub-data from the first bi-directional multiplexer;
a first register which stores the first sub-data from the first bi-directional multiplexer;
a second register which stores the second sub-data from the second bi-directional multiplexer;
a first I/O pad which outputs the first sub-data from the first register to outside; and
a second I/O pad which outputs the second sub-data from the second register to the outside.

2. The nonvolatile memory device of claim 1, further comprising:
a second memory cell array which stores second data,
wherein the second bi-directional multiplexer receives the second data, and distributes the second data into third sub-data and fourth sub-data,
the first bi-directional multiplexer receives the third sub-data,
the first register receives and stores the third sub-data from the first bi-directional multiplexer,
the second register receives and stores the fourth sub-data from the second bi-directional multiplexer, and
the first I/O pad and the second I/O pad output the third sub-data and the fourth sub-data to the outside, respectively.

3. The nonvolatile memory device of claim 2, wherein the first register comprises a first sub-register and a second sub-register,
the first sub-register is connected to a part of the first I/O pad, and
the second sub-register is connected to a remainder of the first I/O pad.

4. The nonvolatile memory device of claim 3, wherein the first register is one of first registers and the first I/O pad is one of first I/O pads provided in one-to-one relationships with the first registers.

5. The nonvolatile memory device of claim 4, wherein the second register comprises a third sub-register and a fourth sub-register,
the third sub-register is connected to a part of the second I/O pad, and
the fourth sub-register is connected to a remainder of the second I/O pad.

6. The nonvolatile memory device of claim 2, further comprising:
a second memory cell array which stores third data;
a third bi-directional multiplexer which receives the third data and distributes the third data into fifth sub-data, sixth sub-data and seventh sub-data;
a third register which stores the seventh sub-data from the third bi-directional multiplexer, and
a third I/O pad which outputs the seventh sub-data from the third register to the outside,
wherein the third bi-directional multiplexer transmits the fifth sub-data and the sixth sub-data to the second bi-directional multiplexer,
the second bi-directional multiplexer transmits the sixth sub-data to the second register,
the second bi-directional multiplexer transmits the fifth sub-data to the first bi-directional multiplexer,
the first bi-directional multiplexer transmits the fifth sub-data to the first register,
the first I/O pad outputs the fifth sub-data from the first bi-directional multiplexer to the outside, and
the second I/O pad outputs the sixth sub-data from the second bi-directional multiplexer to the outside.

7. The nonvolatile memory device of claim 6, wherein the third register comprises a fifth sub-register and a sixth sub-register,
the fifth sub-register is connected to a part of the third I/O pad, and
the sixth sub-register is connected to a remainder of the third I/O pad.

8. The nonvolatile memory device of claim 7, wherein the third register and the third I/O pad are in a one-to-one relationship.

9. The nonvolatile memory device of claim 2, wherein the first memory cell array includes a first page buffer driver,
the second memory cell array includes a second page buffer driver,
the first bi-directional multiplexer receives the first data from the first page buffer driver, and
the second bi-directional multiplexer receives the second data from the second page buffer driver.

10. A nonvolatile memory device, comprising:
a first I/O pad which receives first data;
a first register which stores the first data and transmits the first data to the first I/O pad;
a first bi-directional multiplexer which transmits the first data to the first register, the first data including first sub-data and second sub-data;
a second bi-directional multiplexer which transmits the second sub-data;
a first memory cell array which stores the first sub-data and transmits the first sub-data to the first bi-directional multiplexer; and
a second memory cell array which stores the second sub-data and transmits the second sub-data to the second bi-directional multiplexer.

11. The nonvolatile memory device of claim 10, further comprising:
a second I/O pad which receives second data; and
a second register which stores the second data and transmits the second data to the second I/O pad,
wherein the second data includes third sub-data and fourth sub-data,
the first bi-directional multiplexer transmits the third sub-data to the second bi-directional multiplexer, the first memory cell array stores the third sub-data, and
transmits the third sub-data to the first bi-directional
multiplexer, and the second memory cell array stores the fourth sub-data
and transmits the fourth sub-data to the second bi-
directional multiplexer.

12. The nonvolatile memory device of claim 11, wherein
the first register includes a first sub-register and a second
sub-register, the first sub-register is connected to a part of the first I/O
pad, and the second sub-register is connected to a remainder of the
first I/O pad.

13. The nonvolatile memory device of claim 12, wherein
the first register is one of first registers and the first I/O pad
is one of first I/O pads provided in one-to-one relationships
with the first registers.

14. The nonvolatile memory device of claim 13, wherein
the second register includes a third sub-register and a fourth
sub-register, the third sub-register is connected to a part of the second
I/O pad, and the fourth sub-register is connected to a remainder of the
second I/O pad.

15. The nonvolatile memory device of claim 11, further
comprising:

a third I/O pad which receives third data;

a third register which stores the third data and transmits
the third data to the third I/O pad;

a third bi-directional multiplexer which transmits the third
data to the third register, the third data including fifth
sub-data, sixth sub-data and seventh sub-data; and a third memory cell array which stores seventh sub-data, wherein the second bi-directional multiplexer transmits
the fifth sub-data and the sixth sub-data to the third
bi-directional multiplexer, the first bi-directional multiplexer transmits the fifth sub-
data to the second bi-directional multiplexer, the first memory cell array stores the fifth sub-data, and
transmits the fifth sub-data to the first bi-directional
multiplexer, and the second memory cell array stores the sixth sub-data and
transmits the sixth sub-data to the second bi-directional
multiplexer.

16. The nonvolatile memory device of claim 15, wherein
the first register includes a first sub-register and a second
sub-register, the first sub-register is connected to a part of the first I/O
pad, and the second sub-register is connected to a remainder of the
first I/O pad.

17. The nonvolatile memory device of claim 16, wherein
the first register is one of first registers and the first I/O pad
is one of first I/O pads provided in one-to-one relationships
with the first registers.

18. The nonvolatile memory device of claim 17, wherein
the second register includes a third sub-register and a fourth
sub-register, the third sub-register is connected to a part of the second
I/O pad, and the fourth sub-register is connected to a remainder of the
second I/O pad.

19. The nonvolatile memory device of claim 18, wherein
the third register includes a fifth sub-register and a sixth
sub-register, the fifth sub-register is connected to a part of the third I/O
pad, and the sixth sub-register is connected to a remainder of the
third I/O pad.

20. A nonvolatile memory device, comprising:

a first memory cell array and a second memory cell array
in which first data and second data are stored, respec-
tively;

a first bi-directional multiplexer which receives the first
data, the first data including first sub-data and second
sub-data;

a second bi-directional multiplexer which receives the
second data, the second data including third sub-data
and fourth sub-data, the second bi-directional multi-
plexer receiving the second sub-data from the first
bi-directional multiplexer, and transmitting the fourth
sub-data to the first bi-directional multiplexer;

a first register which receives the first sub-data and the
third sub-data from the first bi-directional multiplexer;

a second register which receives the second sub-data and
the fourth sub-data from the second bi-directional mul-
tiplexer;

a first I/O pad which outputs the first sub-data and the
third sub-data from the first register to outside; and a second I/O pad which outputs the second sub-data and
the fourth sub-data from the second register to the
outside, wherein a frequency of a first clock applied to the first
bi-directional multiplexer and the second bi-directional
multiplexer is lower than a frequency of a second clock
applied to the first register and the second register.

* * * * *